United States Patent
Liou et al.

(10) Patent No.: US 7,779,215 B2
(45) Date of Patent: Aug. 17, 2010

(54) METHOD AND RELATED APPARATUS FOR ACCESSING MEMORY

(75) Inventors: Ming-Shi Liou, Taipei Hsien (TW); Bowei Hsieh, Taipei Hsien (TW); Jiin Lai, Taipei Hsien (TW)

(73) Assignee: VIA Technologies Inc., Hsin-Tien, Taipei Hsien (TW)

( * ) Notice: Subject to any disclaimer, the term of this patent is extended or adjusted under 35 U.S.C. 154(b) by 0 days.

(21) Appl. No.: 10/906,748

(22) Filed: Mar. 4, 2005

(65) Prior Publication Data

US 2005/0289317 A1 Dec. 29, 2005

(30) Foreign Application Priority Data

Jun. 24, 2004 (TW) .............................. 93118387 A

(51) Int. Cl.
*G06F 12/06* (2006.01)
(52) U.S. Cl. ..................... 711/157; 711/168; 711/172
(58) Field of Classification Search ................ 711/147, 711/170, 157, 168, 172, 158
See application file for complete search history.

(56) References Cited

U.S. PATENT DOCUMENTS

| 5,619,471 | A * | 4/1997 | Nunziata .............. 365/230.03 |
| 6,065,092 | A * | 5/2000 | Roy .............................. 711/5 |
| 6,877,076 | B1 * | 4/2005 | Cho et al. ................... 711/157 |
| 2003/0088742 | A1 * | 5/2003 | Lee et al. ..................... 711/147 |
| 2005/0114587 | A1 * | 5/2005 | Chou et al. ................. 711/103 |

OTHER PUBLICATIONS

Cosair, "Currents:Memory News from Corsair" Aug. 2004, Corsair pp. 1-2.*
Besedin, Dmitri "RAM FAQ 1.0" May 14, 2006 retrieved from the Internet Dec. 14, 2009 from http://ixbtlabs.com/articles2/mainboard/ram-faq-2006.html.*
Publisher: HP, Title: An overview of system memory technologies, technology brief, 8th edition, Apr. 1, 2009.
Publisher: Kingston, Title: Ultimate Memory Guide-interleaving, Jul. 24, 2008, printed on Apr. 7, 2010, from http://www.kingston.com/tools/umg/umg03.asp.
Publisher: Kingston, Title: Memory Ranks and Intel E7320/E7520 Chipset-based Servers, Jul. 24, 2008.
Publisher: Kingston, Title: Ultimate Memory Guide-bank, Jul. 24, 2008, printed on Apr. 7, 2010, from http://www.kingston.com/tools/umg/umg02.asp.

* cited by examiner

*Primary Examiner*—Reginald G Bragdon
*Assistant Examiner*—Kenneth M Lo
(74) *Attorney, Agent, or Firm*—Winston Hsu

(57) ABSTRACT

A method for utilizing the multi-channel transmission bandwidth in an asymmetrically arranged memory is provides. The present invention defines symmetrically arranged parts of the memory ranks of the memory as a virtual ranks. If data is stored in symmetrically arranged memory ranks of the memory, channels corresponding to the symmetrically arranged memory ranks could be simultaneously utilized to transfer data. If data is stored in an asymmetrically arranged memory rank of the memory, the channel corresponding to the asymmetrically arranged memory rank could only be utilized to transfer data.

20 Claims, 8 Drawing Sheets

METHOD AND RELATED APPARATUS FOR ACCESSING MEMORY

BACKGROUND OF INVENTION

1. Field of the Invention

The invention relates to a memory accessing method and related memory accessing device, and more particularly, to a memory accessing method and related memory accessing device capable of increasing accessing efficiency in a asymmetric multi-channel memory device.

2. Description of the Prior Art

Microprocessor systems, such as computer systems, have become one of the most important hardware devices in today's modern information society. Therefore, demands for increasing the efficiency of the microprocessor system have become greater and greater. As known by those of ordinary skill in the art, the computer system is operated through the cooperation of a central processing unit (CPU), a chip set (such as implemented by north-bridge chips), and a main memory. For example, the main memory can be a random accessing device for storing program codes and data. The CPU accesses and executes the program codes and the related data through the chip set to achieve functions of the computer system. As mentioned above, it is well-known that the key point to increase the efficiency of the computer/microprocessor system is to increase the accessing efficiency of the main memory.

It is also known by those skilled in the art that the main memory includes one or several memory modules in a typical computer system. Each memory module could be with one or two memory ranks, and each memory rank could be with a plurality of memory devices to store data. For example, in the present computer system standard, a single-sided or double-sided dual-inline memory module (DIMM) is disclosed. The single-sided memory module has memory devices on one side, and these memory devices are connected as a memory rank. Conversely, the double-sided memory module has memory devices on both two sides, and memory devices of each side are respectively connected to a memory rank. Therefore, the double-sided memory module can provide two memory ranks with the same memory capacity. The present computer system could include a plurality of memory modules. These memory modules could be integrated as a single memory through the chipset control so that the memory modules are integrated to a memory capacity that supports the computer system.

SUMMARY OF INVENTION

The invention provides a memory accessing method and related memory accessing apparatus with capable of utilizing the characteristic of a double-channel in an asymmetrically arranged memory, to solve the above-mentioned problem.

A multi-channel memory accessing method of the present invention, each channel respectively connects to at least one memory rank, and the accessing method including: determining whether a target memory rank of accessing data belongs to a virtual rank; if the target memory rank does not belong to the virtual rank, utilizing a predetermined transmission bandwidth to access the data; and if the target memory rank belongs to the virtual rank, utilizing times of the predetermined transmission bandwidth to access the data.

A multi-channel memory accessing apparatus of the present invention including: a controlling chip; a plurality of memory modules, wherein each memory module comprises at least one memory rank; and a plurality of channels, wherein each channel respectively corresponds to one of the memory modules for connecting the memory module and the controlling chip and transferring data of the at least one memory rank corresponding to the memory module; wherein if there respectively has a first memory rank with same memory capacity on each channels, the controlling chip defines the plurality of first memory ranks on each channels as a virtual rank.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
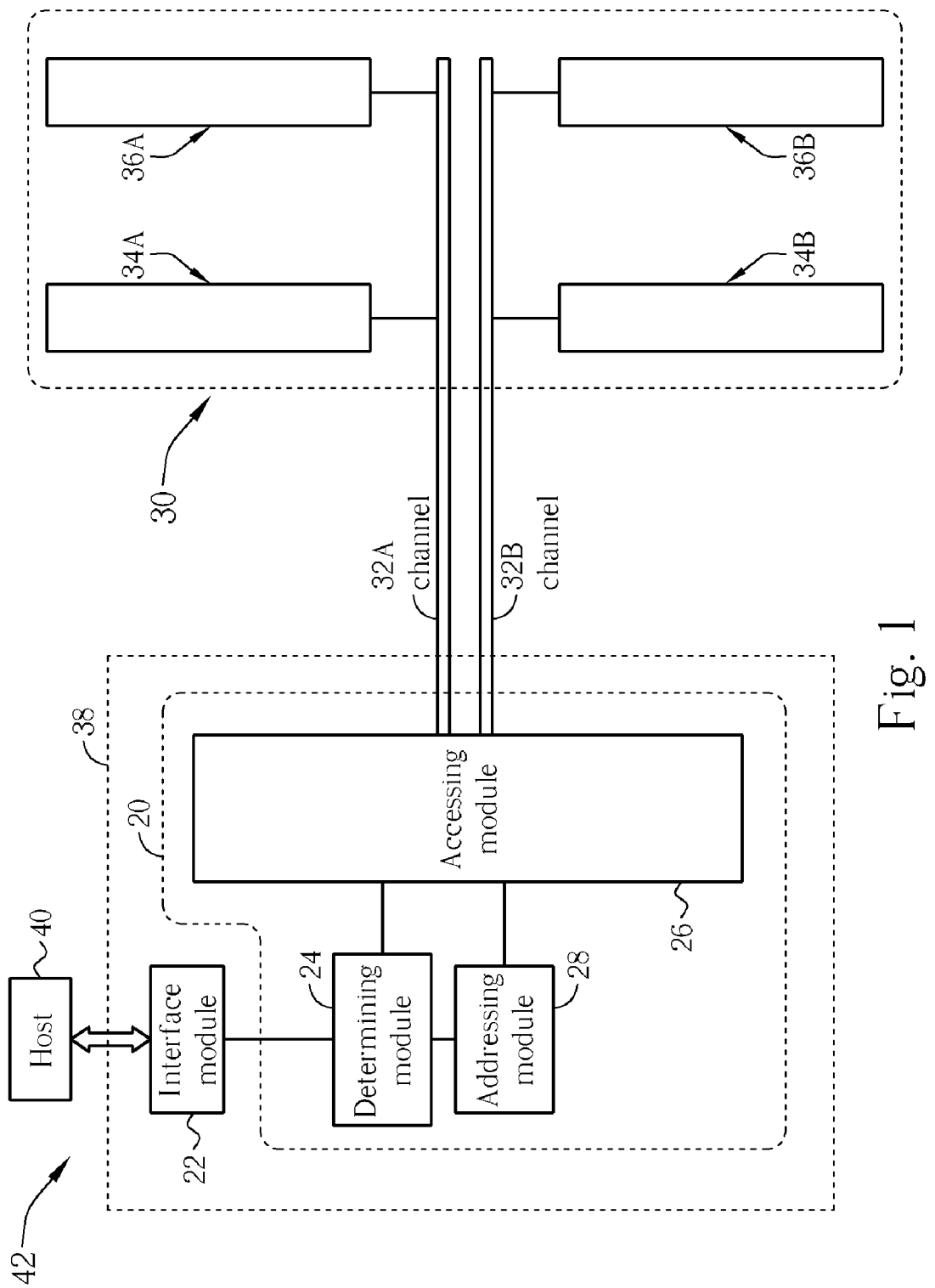
FIG. 1 is a block diagram of a symmetrically positioned memory device in a computer system according to the present invention.

Please refer to FIG. 1, which is a block diagram of a controller 20 applied in a chipset 38 of a computer system 42 to perform accessing control of a double-channel memory 30 according to the present invention. In the computer system 42 (for example, a personal computer or other microprocessor systems), the chipset 38 could be a memory accessing control chip, being as an accessing interface of the memory 30. Therefore, a host 40 could access memory 30 through the above-mentioned chipset 38. The host 40 could be a central processing unit (CPU), other devices or circuits with capable of performing direct memory accessing (DMA) operations.

Furthermore, the chipset 38 includes an interface module 22 and a controller 20. In addition, in order to achieve a technique of the present invention, the controller 20 has a determining module 24, an accessing module 26, and an addressing module 28. The memory 30 has a plurality of slots (as 34A, 34B, 36A, and 36B shown in FIG. 1), a memory module (for example, a random accessing double-sided memory module, DIMM) could be plugged in one slot. Memory capacity of memory 30 providing to the host 40 depends on total memory modules plugged into the slots. The chipset 38, the channel 32A, 32B and each memory module inside the memory 30 are regarded as a multi-channel (e.g., a double-channel) memory accessing apparatus.

In order to access the data stored in the memory module plugged in each slot, the accessing module 26 transfers instructions and signals to access the memory modules. If a double-sided memory module with two memory ranks is plugged in one slot, the slot could respectively transfer control signals to corresponding different memory ranks on the same memory module. In addition, each memory module could transfer the data stored in the memory module through the channels connected to the certain slot to respond the access control instructions and signals.

As shown in FIG. 1, the slot 34A and 36A are connected to the channel 32A, and the slot 34B and 36B are connected to the channel 32B. Therefore, the memory module plugged in the slot 34A or 36A could transfer data through the channel 32A. Similarly, the memory module plugged in the slot 34B or 36B could transfer data through the channel 23B.

A more detailed description of how the chip set 38 performs the access controlling operation on the memory device 30 is illustrated as follows.

When the computer system 42 is turned on, the computer system 42 tests the memory 30 (for example, the computer system 42 executes the basic input output system (BIOS) to test the memory 30) so that the computer system 42 could detect the position/configuration of each memory module inside the memory 30. For example, the memory capacity of each memory module plugged in each slot could be detected by the computer system 42 through the above-mentioned operation. Therefore, the computer system 42 ensures the whole memory capacity is provided by the memory 30. The chipset 38 addresses the whole memory capacity provided by the memory 30. That is, the chipset 38 defines the memory 30 as different addresses (such as the physical addresses) and establishes a mapping relationship between the addresses and the memory ranks. Thus the host 40 could randomly access data of the memory 30. For example, assuming that memory modules installed in the memory 30 could totally provide three memory ranks, the chipset 38 maps memory space, provided by the three memory ranks, to different addresses. When the host 40 has to store data into a given address, the chipset 38 determines the target memory rank corresponding to the given address, then the chipset 38 utilizes control signals to transfer data into the corresponding memory rank and thereby store data. Similarly, if the host 40 has to read data from a certain address, the chipset 38 determines the target memory rank corresponding to the given address, and then the chipset 38 utilize the corresponding control signals to read data from the memory rank.

The present invention could also perform different modes to access memory 30 according to the arrangement of memory 30.

Figure 2:
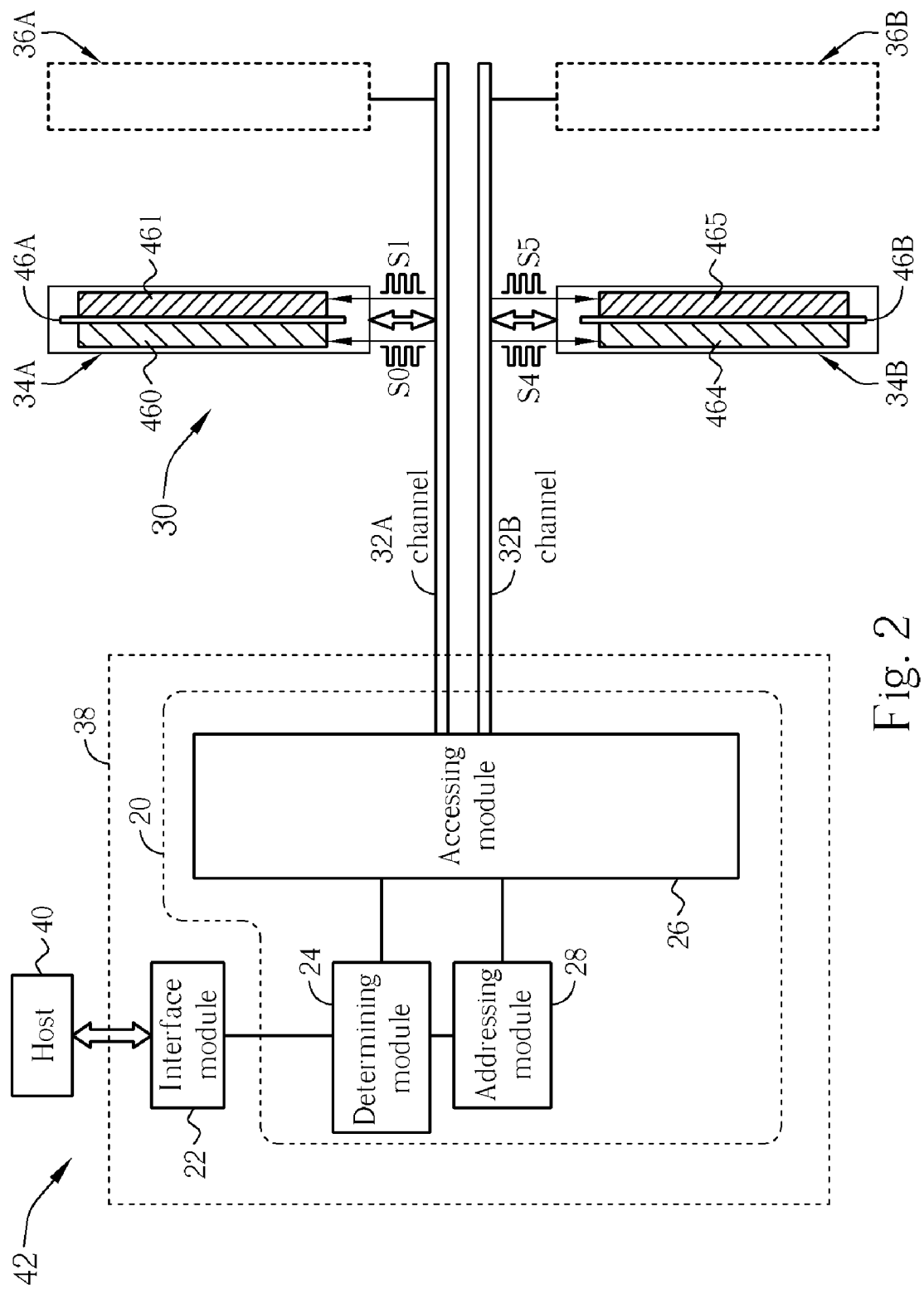
FIG. 2 is a diagram of the memory device shown in FIG. 1 positioned symmetrically.

The first embodiment of the present invention is shown in FIG. 2 and FIG. 2. FIG. 2 is a diagram illustrating a memory access apparatus 42, wherein the memory 30 is symmetrically arranged. In this embodiment shown in FIG. 2, assuming that double-sided memory modules 46A and 46B are respectively plugged in the slots 34A and 34B. The memory module 46A has two memory ranks labeled 460 and 461, and the memory module 46B also has two memory ranks labeled 464 and 465. The memory ranks 460 and 461 receive the corresponding control signals S0 and S1 respectively through the slots 34A; and the memory ranks 464 and 465 receive the corresponding control signals S4 and S5 respectively through the slots 34B.

In FIG. 2, Assuming the memory rank 460, which connects to the channel 32A, has same memory capacity with compared to the memory rank 464, which connects to the channel 32B; also, assuming the memory rank 461, which connects to the channel 32A, has same memory capacity with compared to the memory rank 465, which connects to the channel 32B. As a result, the memory 30 is regarded as a double-channel symmetrically arranged memory. When the memory 30 is symmetrically arranged, controller 20 of the present invention could define the symmetrically arranged memory ranks on the double-channel as a virtual memory rank, and access the memory 30 through the double-channel transmission bandwidth.

As FIG. 2 shows, due to symmetrically arranged memory, the addressing module 28 would define the memory ranks 460 and 464 as a virtual rank, and defines the memory ranks 461 and 465 as another virtual rank. The whole memory capacity provided by the memory 30 could be mapped to corresponding addresses.

When storing data (for example, 8 QWs of data, where one QW (quad-word) is 16 bits) into memory 30, then the accessing module 26 would divide the data into two parts (e.g., each part having 4 QW). These two parts of data are respectively stored into the symmetric memory ranks, which are defined as same virtual rank, through the two channels. For example, one part of data is stored into the memory rank 460 (or 461), another part of data is stored into memory rank 464 (or 465). Because the two parts of data are respectively transferred to corresponding memory ranks at the same time through the two channels, as a result, the double-channel transmission bandwidth is utilized the same time.

Similarly, when read the data from the target virtual rank, the accessing module 26 would respectively read the two parts of data from symmetric memory ranks (ex. from memory ranks 460 and 464 or from memory ranks 461 and 465) through the two channels and interleave the two parts of data into the original data.

Figure 3:
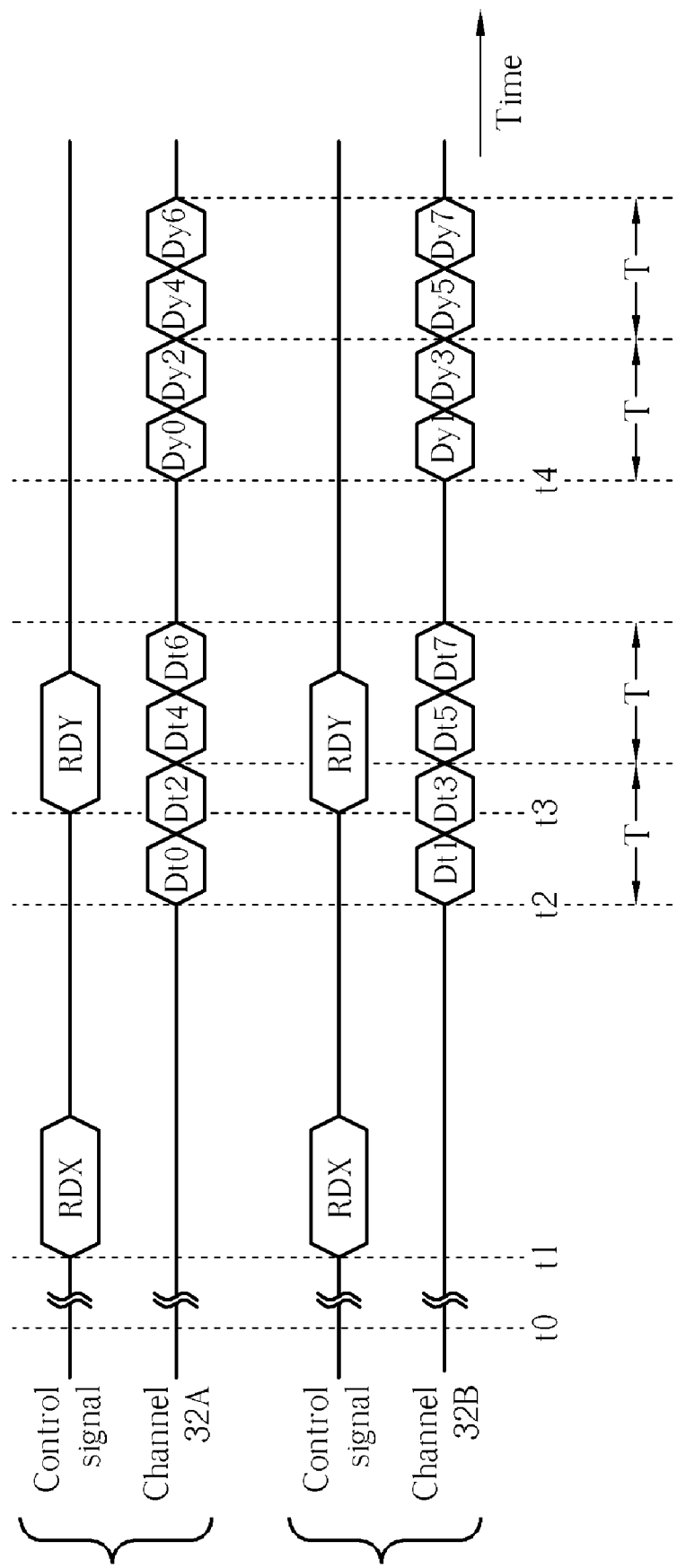
FIG. 3 is a timing chart of each related data signal when the chip set accesses data from the memory device according to the symmetrically positioned memory device shown in FIG. 2.

FIG. 3 is a timing chart of each related data signal when the chipset 38 accesses data from the memory 30 according to the symmetrically arranged memory 30 shown in FIG. 2. And please note that the horizontal axis shown in FIG. 3 shows time.

Assuming that the host 40 requests to read a 8 QW data, which is composed of eight data blocks Dt0 to Dt7 and each one data block stands for 1 QW, of a certain address from the memory 30 at time t0. Assuming the mapping address is located in the virtual rank formed by the memory ranks 460 and 464. The accessing module 26 simultaneously utilizes similar reading controlling instructions RDX as control signals S0 and S4 (shown in FIG. 2) at time t1, and then accessing module 26 respectively transfers the control signals S0 and S4 to the memory ranks 460 and 464 with connected to the two channels. At time t2, the memory rank 460 orderly transfers the data block Dt0, Dt2, Dt4, and Dt6 through the channel 32A. Simultaneously the memory rank 464 orderly transfers the data blocks Dt1, Dt3, Dt5, and Dt7 through the channel 32B. The chipset 38 interleaves data blocks Dt0 to Dt7 into the original 8 QW data. In other words, when an 8 QW data has to be stored into the symmetrically arranged memory 30, the chipset 38 could symmetrically control the symmetric memory ranks of the two channels and respectively stores 4 QW data in each memory rank. This is, the chipset 38 could divide the $1^{st}$, $3^{rd}$, $5^{th}$, and $7^{th}$ QW as one part of the 8 QWs data and divide the $2^{nd}$, $4^{th}$, $6^{th}$, and $8^{th}$ QW as another part of the 8 QWs data then respectively stores the divided two parts of 8 QWs data into two memory ranks, which is regarded as a virtual rank. If the 8 QWs data has to be read from the virtual rank of the symmetrically arranged memory device 30, the chipset 38 could respectively read data blocks from the two memory ranks (each memory rank has four data blocks in it) of the virtual rank through the two channels; and interleaves these eight data blocks into the original 8 QW data.

As mentioned above, if the memory 30 is symmetrically arranged memory, the chipset 38 could utilize the same control instruction and control signal to respectively control the symmetric memory ranks of the double-channel to access data. Thus the 8 QWs data could be transferred on the two channels (double-channel) at the same time. Comparing to the prior art, it only takes two period times (2T) to complete the 8 QWs data transmission (assuming that the memory module is a double-data-rate memory module). Furthermore, the double-channel symmetric accessing could reduce the accessing latency. For example, at time t3, the accessing module 26 could transfer another control instruction RDY as the control signal so that the symmetric memory ranks can utilize the double-channel to transfer another 8 QWs data Dy0 to Dy7 in order to transfer another 8 QWs data.

But if the memory is asymmetrically arranged, the foregoing mention method with high transmission bandwidth could not be utilized. If the memory is asymmetrically arranged, the chipset could not utilize symmetric control signals to control different memory ranks on the different channels at the same time. Regardless of which memory rank the data is stored in, the chipset could only access one memory rank at a time and transfer data through one channel at a time. In other words, one 8 QWs data can only be transferred through one channel. That is, four period times (4T) are necessary to complete the 8 QWs data transmission.

The present invention provides a method and an apparatus for utilizing the multi-channel transmission bandwidth in an asymmetrically arranged memory, so that data transmission efficiency could be increased. In the present invention, even when a memory is asymmetrically arranged, parts of the symmetrically arranged memory ranks are still defined as a virtual rank, as a result, the multi-channel transmission bandwidth could be applied. Taking double-channel memory as examples, more detail description is illustrated as follows.

Figure 4:
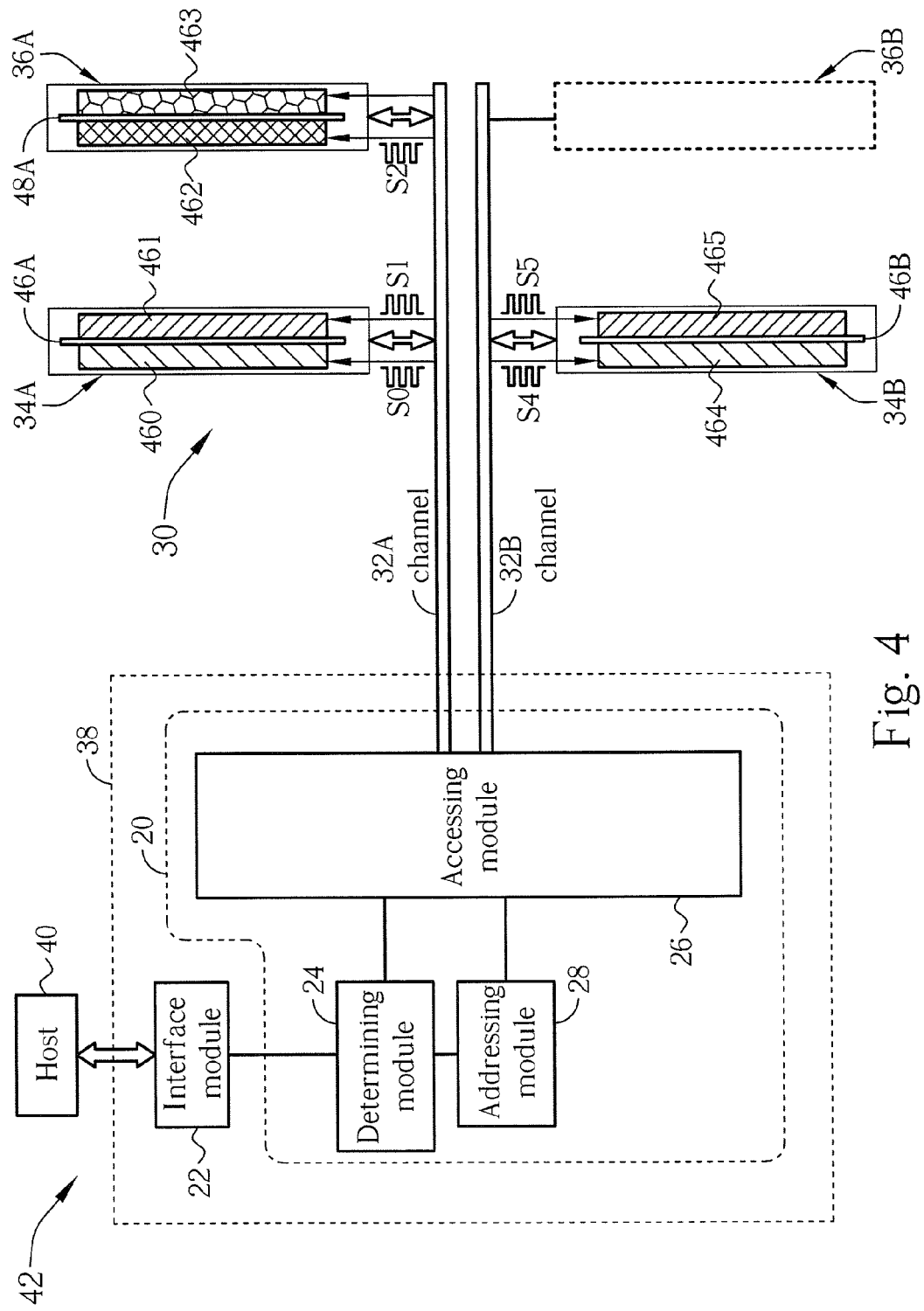
FIG. 4 is a diagram of a non-symmetrically positioned memory device in a computer system according to the present invention.
Figure 5:
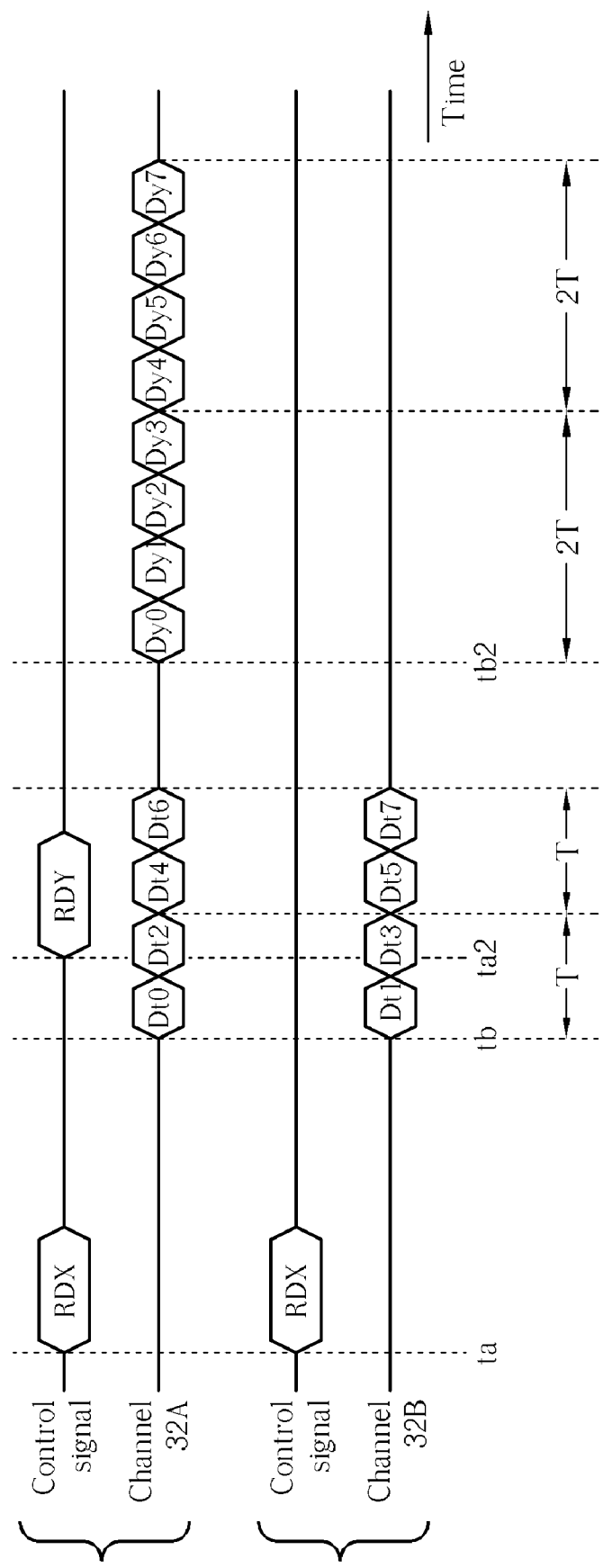
FIG. 5 is a timing chart of each related signal when the non-symmetric memory device shown in FIG. 4 is accessed according to the present invention.

The second embodiment of the present invention is shown in FIG. 4 and FIG. 5. Assuming that the memory 30 in FIG. 4 is an asymmetrically arranged memory. FIG. 5 is a timing chart of related data signals of accessing the memory shown in FIG. 4 according to the present invention. The horizontal axis of FIG. 5 is time axis.

Assuming the asymmetrically arranged memory 30, shown in FIG. 4, has three slots 34A, 36A and 34B with corresponding memory modules 46A, 48A and 46B plugged in respectively. The memory module 46A and 46B both are double-sided memory module. The memory module 46A has memory ranks 460 and 461 and the memory module 48A has memory ranks 464 and 465. Assuming the memory ranks 460 and 464 in two channels 32A and 32B with the same memory capacity and the memory ranks 461 and 465 in two channel 32A and 32B with the same memory capacity are regarded as symmetric memory ranks and are the symmetrical parts of the asymmetrically arranged memory 30. Alternatively, the double-sided memory module 48A having memory ranks 462 and 463 in channel 32A is the asymmetrical parts of the asymmetrically arranged memory 30, due to the memory ranks 462 and 463 have no corresponding memory ranks in another channel 32B.

Although the memory 30 is asymmetric, the memory ranks 460 and 461 have corresponding memory ranks 464 and 465 with the same memory capacity in another channel; as a result, the addressing module 28 could define the memory ranks 460 and 464 as a virtual rank. The virtual ranks could be accessed in the double-channel data transmission bandwidth. The remained memory ranks 462 and 463 in channel 32A have no corresponding memory ranks with same capacity in channel 32B, so memory ranks 462 and 463 could only be accessed in one-channel data transmission bandwidth.

In the present invention when the computer system 42 is turned on and detects that the memory 30 is asymmetrically arranged, addressing module 28 defines symmetrically arranged parts of memory ranks of the memory 30 on the double-channel as a virtual rank. Furthermore, the addressing module 28 sets a mapping relationship according to the above-mentioned arranged relationship of the memory ranks. When the host 40 writes data into a certain address of the memory 30, the determining module 24 first determines which memory space (the virtual ranks of the double-channel or the memory ranks of the single channel) that the address is mapped to. If the address is mapped to the memory space of the virtual ranks, the accessing module 26 could utilize the same control signal to control the symmetric memory ranks and utilize the double-channel to the symmetric memory ranks to transfer different parts of the data so that the data could be transferred in the double-channel data transmission bandwidth. Alternatively, if the address is mapped to the memory space of asymmetrically arranged memory ranks, the accessing module 26 could transfer the data to the same memory rank in one-channel transmission bandwidth.

Please refer to FIG. 4 and FIG. 5. Assuming that the host 40 writes two 8 QW data to memory 30, and each 8 QW data is composed of eight data blocks. If the address of the first 8 QW data (Dt0-Dt7) is mapped to the virtual rank of the symmetrically arranged memory ranks 461 and 465 shown in FIG. 4, thus the first 8 QW data (Dt0-Dt7) is divided into two parts and respectively stored in the memory ranks 461 and 465. If the address of the second 8 QW data (Dy0-Dy7) is mapped to the memory ranks 462, which has no symmetrically arranged memory rank on another channel, thus the second 8 QW data (Dy0-Dy7) is stored in the memory rank 462.

When the host 40 has to access the above-mentioned two pieces of data, the determining module 24 determines the addresses to which the two data are mapped to. When accessing the first 8 QW data, the determining module 24 determines that the first 8 QW data is stored in the virtual rank of the symmetrically arranged memory ranks 461 and 465. Then the accessing module 26 simultaneously utilizes the same control instruction RDX as the control signals S1 and S5 of channel 32A and 32B to sequentially transfer data blocks Dt0, Dt2, Dt4, Dt6 and Dt1, Dt3, Dt5, Dt7 of the first 8 QW data from memory rank 461 and 465 simultaneously at time tb. In other words, the accessing module 26 could utilize the double-channel transmission bandwidth to access data when the data is stored in the symmetrically arranged memory ranks.

When accessing the second 8 QW data, the determining module 24 determines that the second 8 QW data is stored in the memory rank 462. Then the accessing module 26 utilizes a control instruction RDY as the control signal S2 of channel 32A to sequentially transfer data blocks Dy0-Dy7 of the second 8 QW data stored in the memory rank 462 at time tb2. In other words, the accessing module 26 could utilize the single-channel transmission bandwidth to access data when the data is stored in the asymmetrically arranged memory rank.

As mentioned above, although the memory 30 is asymmetric, the present invention could still utilize the advantages of the double-channel data transmission for the symmetrically arranged parts of memory ranks of the memory 30. With compared to the prior art, if the memory is asymmetric, one channel is utilized to access data. Taking the example of FIG. 4 and FIG. 5, because the memory 30 is asymmetric, the prior art cannot define the symmetric memory ranks as the same virtual rank. Therefore, the prior art can only utilize one channel (time after timing tb2) to transfer the first 8 QW data (Dt0-Dt7) from the memory rank 461. In other words, the prior art cannot utilize the characteristic "the memory rank 461 has corresponding memory rank 465 with the same memory capacity on the other channel" as well as the present invention.

Figure 6:
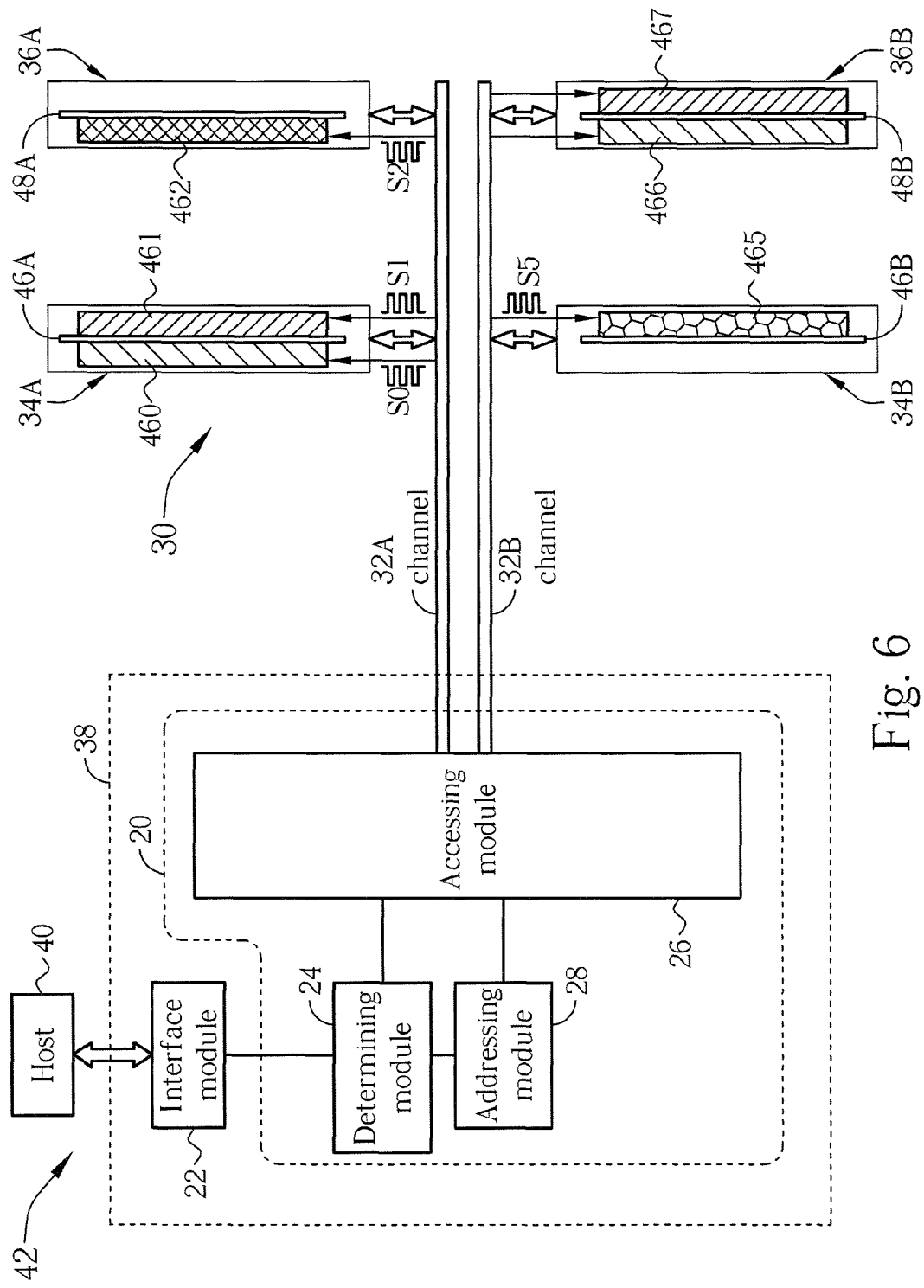
FIG. 6 and FIG. 7 are diagrams of two other symmetrically positioned memory devices according to the present invention.

The third embodiment of the present invention is shown in FIG. 6. Assuming the memory 30 has 4 memory modules 46A, 46B, 48A, and 48B, where the memory modules 46A and 48B are both double-sided and the memory modules 48A and 46B are both single-sided. The memory module 46A has memory ranks 460 and 461, and the memory module 48B has memory ranks 466 and 467. The memory module 48A has one memory rank 462 and the memory module 46B has one memory rank 465. Assuming that the memory rank 460 on channel 32A has the same memory capacity with the memory rank 466 on channel 32B, that is, the memory ranks 460 and 466 are symmetrically arranged. Similarly, the memory rank 461 on channel 32A has the same memory capacity with the memory rank 467 on channel 32B, that is, the memory ranks 461 and 467 are symmetrically arranged. In the present invention, addressing module 28 could define the memory ranks 460 and 466 as a first virtual rank, and define the memory ranks 461 and 467 as a second virtual rank. In addition, data stored in the first virtual rank or stored in the second virtual rank could be accessed through double-channel (similar to the operation of accessing the symmetric memory ranks 461 and 465 shown in FIG. 4). Furthermore, if the memory ranks 462 on channel 32A has different memory capacity with and the memory rank 465 on channel 32B, thus the memory ranks 462 and 465 are asymmetric, thus, data stored in the memory rank 462 or stored in the memory rank 465 could only be accessed through single channel (similar to the operation of accessing the asymmetric memory rank 462 shown in FIG. 4).

Figure 7:
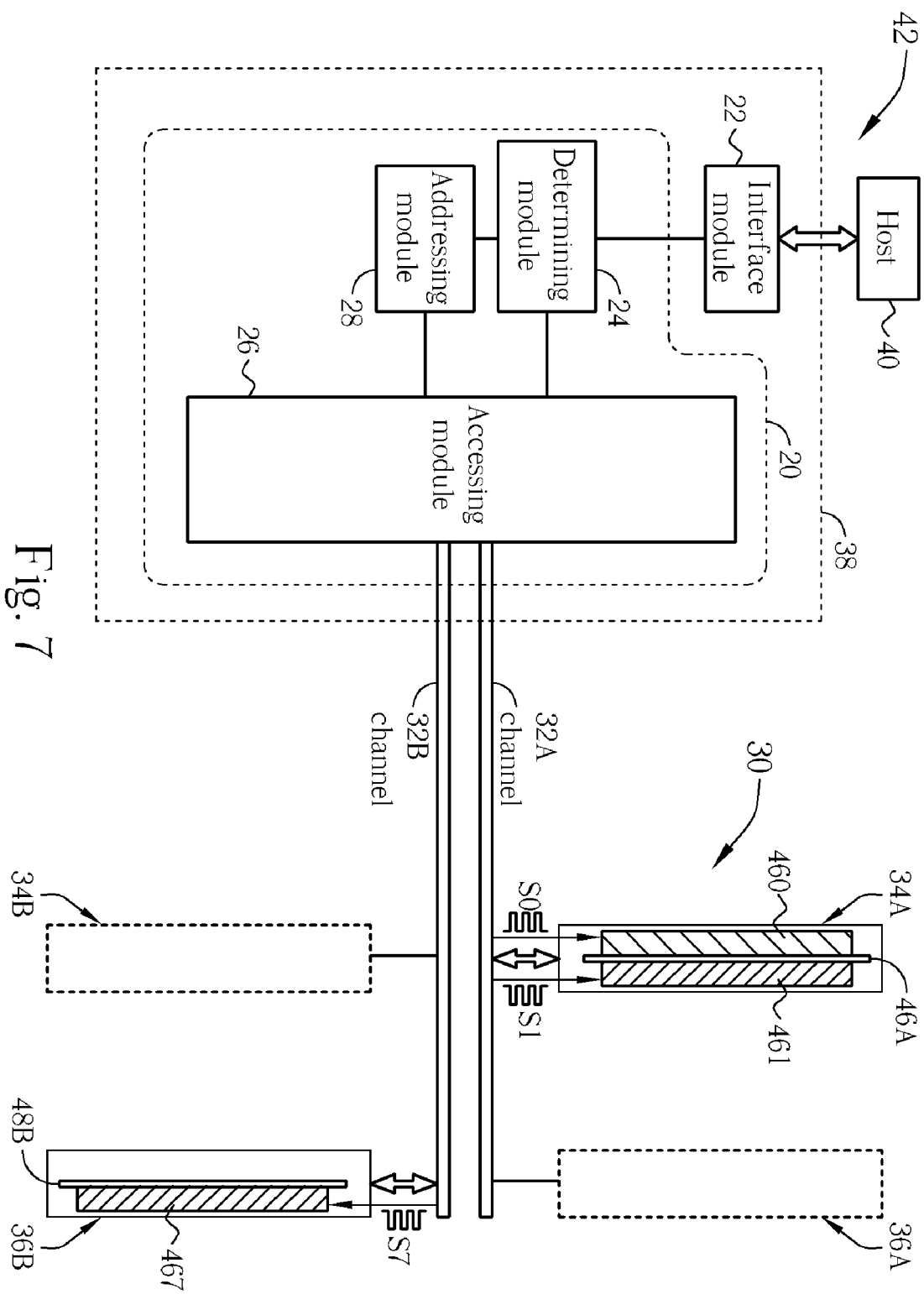

The fourth embodiment of the present invention is shown in FIG. 7. Assuming the memory 30 has memory modules 46A and memory module 48B, where memory module 46A is double-side and memory module 48B is single-side. The memory module 46A has two memory ranks 460 and 461 and the memory module 48B has one memory rank 467. Assume that the memory ranks 460, 461, and 467 have the same memory capacity. Because one of the two memory ranks 460 and 461 of the memory module 46B on channel 32A does not have corresponding memory rank on channel 32B, therefore, the memory 30 is asymmetric. Under this condition, addressing module 28 of the present invention defines the memory rank 460 and memory 467 as a virtual rank (or defines memory rank 461 and memory rank 467 as a virtual rank). If a data is accessed from a certain address, the determining module 24 determines the memory space that the address corresponds to. If the address belongs to a memory space provided by the memory rank 461 (or memory rank 460), the accessing module 26 only utilizes channel 32A to access data, so that the single-channel transmission bandwidth is utilized. If the address belongs to a memory space provided by the virtual rank of the symmetric memory ranks 460 and 467 (or memory ranks 461 and 467), the accessing module 26 simultaneously utilizes two channels 32A and 32B to access data, so that the double-channel transmission bandwidth is utilized.

Figure 8:
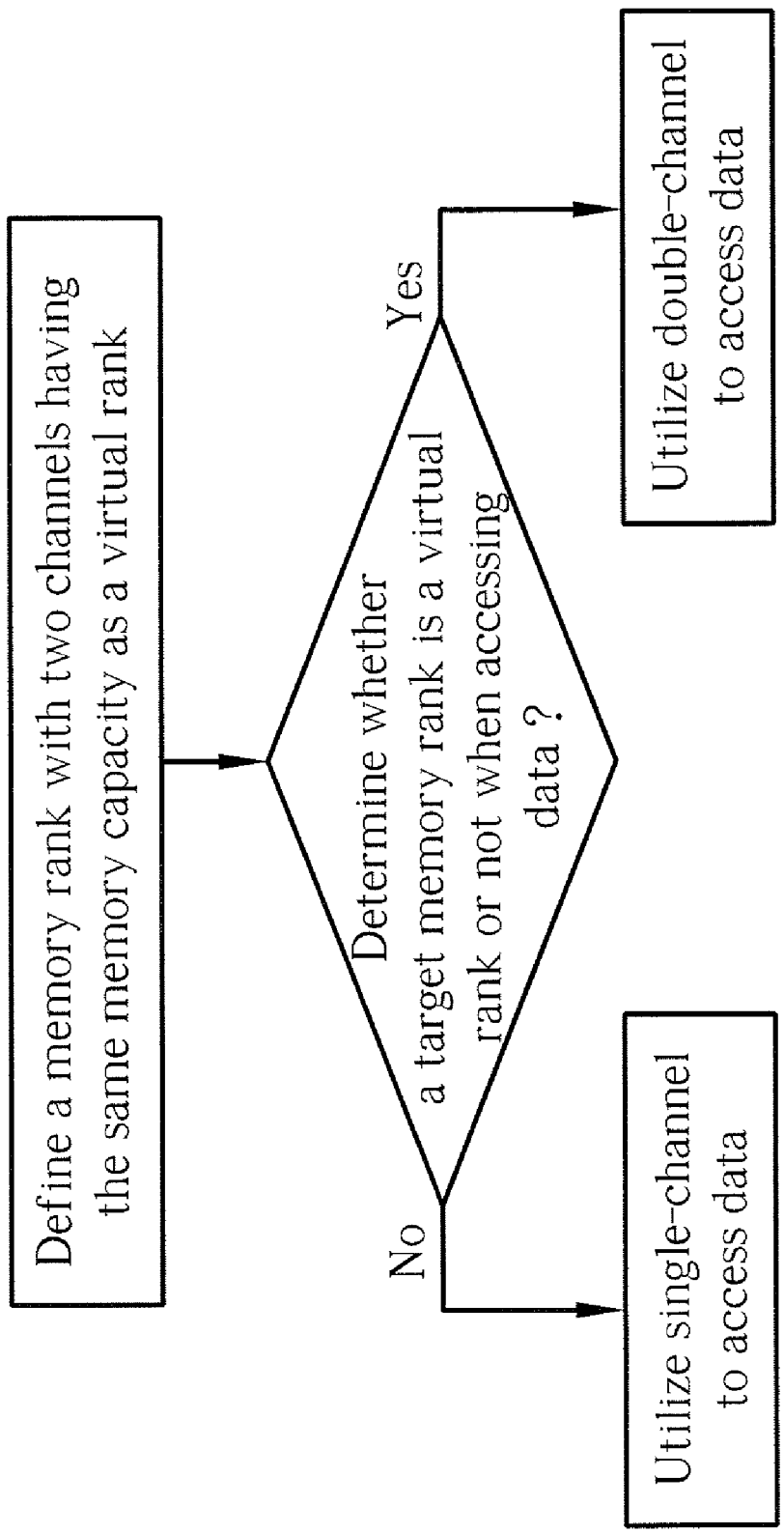
FIG. 8 is a flow chart of accessing data from a memory according to the present invention.

FIG. 8 is a flow chart of accessing an asymmetrically arranged memory according to the present invention. If a first memory rank on first channel has same memory capacity with a second memory rank on second channel, thus defining the first memory rank and the second memory rank as a virtual rank. When data stored in the virtual rank is accessed, the double-channel could be utilized. Conversely, if a third memory rank on first channel has no same memory capacity with a fourth memory rank on second channel, thus when data stored in the third memory rank or in the fourth memory rank is accessed, only single-channel is utilized.

To summarize, in the prior art, if the memory is asymmetrically arranged, the data could be accessed through only one channel with respect to the data stored. In contrast to the prior art, even if the memory asymmetrically arranged, the present invention could define symmetrically arranged parts of the memory ranks of the memory as a virtual ranks. If data is stored in symmetrically arranged memory ranks of the memory, channels corresponding to the symmetrically arranged memory ranks could be simultaneously utilized to transfer data. If data is stored in an asymmetrically arranged memory rank of the memory, the channel corresponding to the asymmetrically arranged memory rank could only be utilized to transfer data. Therefore, the present invention could still take the advantages of the double-channel, even if the memory is not asymmetrical arranged. As a result, in the present invention, the accessing efficiency of the memory could be increased. Furthermore, in the embodiments of the invention, functions of the determining module 24 and the addressing module 28 could be implemented by software (for example, the chipset is used for executing software program codes) or hardware). Therefore, this changes the way of accessing the memory according to whether the address is mapped to the symmetric memory ranks during address decoding, page decoding, and command scheduling.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory accessing method for accessing a memory having a first memory rank connected to a first channel and a second memory rank connected to a second channel, the memory accessing method comprising:

determining the memory capacity of the first memory rank and the memory capacity of the second memory rank;

defining the first memory rank and the second memory rank as a virtual memory rank while the memory capacities of the first memory rank and the second memory rank are the same;

accessing data of the virtual memory rank via both the first channel and the second channel simultaneously, wherein the memory is an asymmetrically arranged memory and at least have a third memory rank connected to the second channel; and accessing data of the third memory rank via the second channel.

2. The memory accessing method of claim 1, wherein for a write request, the method further comprises dividing data into a plurality of data blocks and writing the data blocks into the virtual memory rank via the first channel and the second channel.

3. The memory accessing method of claim 1, wherein for a read request, the method further comprises reading a plurality of data blocks from the virtual memory rank via the first channel and the second channel; and interleaving the data blocks to regenerate the data.

4. The memory accessing method of claim 1 wherein the first channel and the second channel have a predetermined transmission bandwidth.

5. The memory accessing method of claim 1, while the memory capacities of the first memory rank and the second memory rank are different, accessing data of either the first memory rank or the second memory rank.

6. The memory accessing method of claim 1 wherein the first memory rank and the second memory rank are asymmetrically plugged in slots.

7. The memory accessing method of claim 1, wherein the memory capacity of the third memory rank is different with that of the first memory rank.

8. A memory accessing apparatus comprising:
a first memory rank;
a second memory rank;
a third memory rank; and
a controller coupled to the first memory rank via a first channel and the second and third memory ranks via a second channel;
wherein the controller defines the first memory rank and the second memory rank as a virtual memory rank while the memory capacities of the first memory rank and the second rank are the same, and accesses data of the virtual memory rank via both the first channel and the second channel simultaneously;
wherein the memory is an asymmetrically arranged memory;
wherein the controller accesses data of the third memory rank via the second channel.

9. The memory accessing apparatus of claim 8 wherein while the memory capacities of the first memory rank and the second memory rank are different, the controller accesses data of either the first memory rank or the second memory rank.

10. The memory accessing apparatus of claim 8, wherein for a write request, the controller divides data into a plurality of data blocks and writes the data blocks into the virtual memory rank via the first channel and the second channel.

11. The memory1 accessing apparatus of claim 8, wherein for a read request, the controller reads a plurality of data blocks from the virtual memory rank via the first channel and the second channel, and interleaves the data blocks as data.

12. The channel memory accessing apparatus of claim 8, wherein the first channel and the second channel have a predetermined transmission bandwidth.

13. The memory accessing apparatus of claim 8, wherein the controller comprises:
an accessing module for accessing data from a memory;
an addressing module coupled to the accessing module for addressing the memory; and
a determining module coupled to the accessing module and the addressing module for determining whether the address of data belongs to the virtual memory rank.

14. The memory accessing apparatus of claim 8 wherein the first memory rank and the second memory rank are asymmetrically plugged in slots.

15. The memory accessing apparatus of claim 8, wherein the memory capacity of the third memory rank is different with that of the first memory rank.

16. A chipset for accessing a memory, wherein the memory comprises a plurality of memory ranks, the chipset comprising:
an accessing module, coupled to the memory via a plurality of channels, the accessing modules accesses data of one of the memory ranks via one of the connected channels;
an addressing module, coupled to the accessing module, wherein some of the memory ranks are plugged in different channels, where the addressing module defines one or more virtual memory ranks; wherein a virtual memory rank comprises a pair of memory ranks of the plurality of memory ranks, each connected to different channels and have the same memory capacities; and
a determining module coupled to the accessing module and the addressing module for determining whether the address of data belongs to the virtual memory rank;
wherein the accessing module accesses data of the virtual memory rank via all the connected channels simultaneously, and accesses data of one of the memory ranks via one of the connected channels while the address of data does not belong to a virtual memory rank of the one or more virtual memory ranks;
wherein the memory is an asymmetrically arranged memory.

17. The chipset of claim 16, wherein for a write request, the data is divided into a plurality of data blocks and the data blocks are written into the virtual memory ranks via the connected channels.

18. The chipset of claim 16 wherein for a read request, a plurality of data blocks are read from the virtual memory rank via the connected channels, and the data blocks are interleaved as data.

19. The chipset of claim 16, wherein each channel has a predetermined transmission bandwidth.

20. The chipset of claim 16 wherein the memory ranks of the virtual memory ranks are asymmetrically plugged in slots.

* * * * *